United States Patent
Hong

(10) Patent No.: US 7,683,409 B2
(45) Date of Patent: Mar. 23, 2010

(54) IMAGE SENSOR

(75) Inventor: Ji-Ho Hong, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/106,317

(22) Filed: Apr. 20, 2008

(65) Prior Publication Data

US 2008/0258251 A1  Oct. 23, 2008

(30) Foreign Application Priority Data

Apr. 23, 2007  (KR) .................. 10-2007-0039207

(51) Int. Cl.
*H01L 31/062* (2006.01)
*H01L 31/113* (2006.01)

(52) U.S. Cl. .............. 257/292; 257/288; 257/643; 257/E21.07; 257/E21.17; 257/E21.042; 257/E21.151; 257/E21.189; 257/E21.304; 257/E21.229; 257/E33.064; 257/E33.115

(58) Field of Classification Search .......... 257/288, 257/290, 291, 292, 293, 643, 749, 754, 762, 257/768, 760
See application file for complete search history.

(56) References Cited

U.S. PATENT DOCUMENTS

| | | | |
|---|---|---|---|
| 6,765,230 B2 * | 7/2004 | Murade | 257/59 |
| 6,770,909 B2 * | 8/2004 | Murade | 257/59 |
| 6,809,358 B2 | 10/2004 | Hsieh et al. | |
| 6,861,280 B2 * | 3/2005 | Yamamoto | 438/70 |
| 6,872,975 B2 * | 3/2005 | Murade | 257/59 |
| 7,053,427 B2 * | 5/2006 | Tanigawa | 257/294 |
| 7,493,713 B2 * | 2/2009 | Park | 438/70 |
| 2007/0110921 A1 | 5/2007 | Angelopoulos et al. | |

FOREIGN PATENT DOCUMENTS

CN   1240537   1/2000
KR   210-2002-0076178   10/2002

* cited by examiner

*Primary Examiner*—David Nhu
(74) *Attorney, Agent, or Firm*—Sherr & Vaughn PLLC

(57) ABSTRACT

An image sensor including a second line formed at an upper part of a photodiode region as a transparent electrode for passing light. The second line is composed of a polymeric material having transparency and conductivity.

9 Claims, 3 Drawing Sheets

IMAGE SENSOR

The present application claims priority under 35 U.S.C. 119 to Korean Patent Application No. 10-2007-0039207 (filed on Apr. 23, 2007), which is hereby incorporated by reference in its entirety.

BACKGROUND

Image sensors are semiconductor devices for converting optical images into electric signals and may be classified generally as a charge coupled device (CCD) image sensor or a complementary metal oxide semiconductor (CMOS) image sensor.

The CCD image sensor has shortcomings, such as a complicated driving method, high power consumption and a complicated fabricating process requiring a multi-phased photo processes.

As a result of the afore-noted shortcomings in the CCD image sensors, CMOS image sensors are thought to be the next generation image sensor. CMOS image sensors may include a photodiode region for receiving a light signal and converting the received light signal to an electric signal and a transistor region for processing the electric signal. In this regard, the CMOS image sensor may include a photodiode and a MOS transistor in a unit pixel. The CMOS image sensor may generate an image by sequentially detecting electric signals in a switching mode using the photodiode and the MOS transistor.

The photodiodes in a CMOS image sensor may be horizontally disposed with transistors. Particularly, the photodiodes and the transistors are provided horizontally adjacent to each other on and/or over a semiconductor substrate. Therefore, additional space or surface area is required for the photodiode. The requirement of additional space or surface area may be undesirable as reducing a fill factor region and limiting the possibility of resolution. Moreover, it may be difficult to optimize a process for simultaneously forming photodiodes and transistors on and/or over a semiconductor substrate.

In order to overcome such shortcomings, a method for vertically integrating transistor circuitry and a photodiode was introduced.

Figure 1:
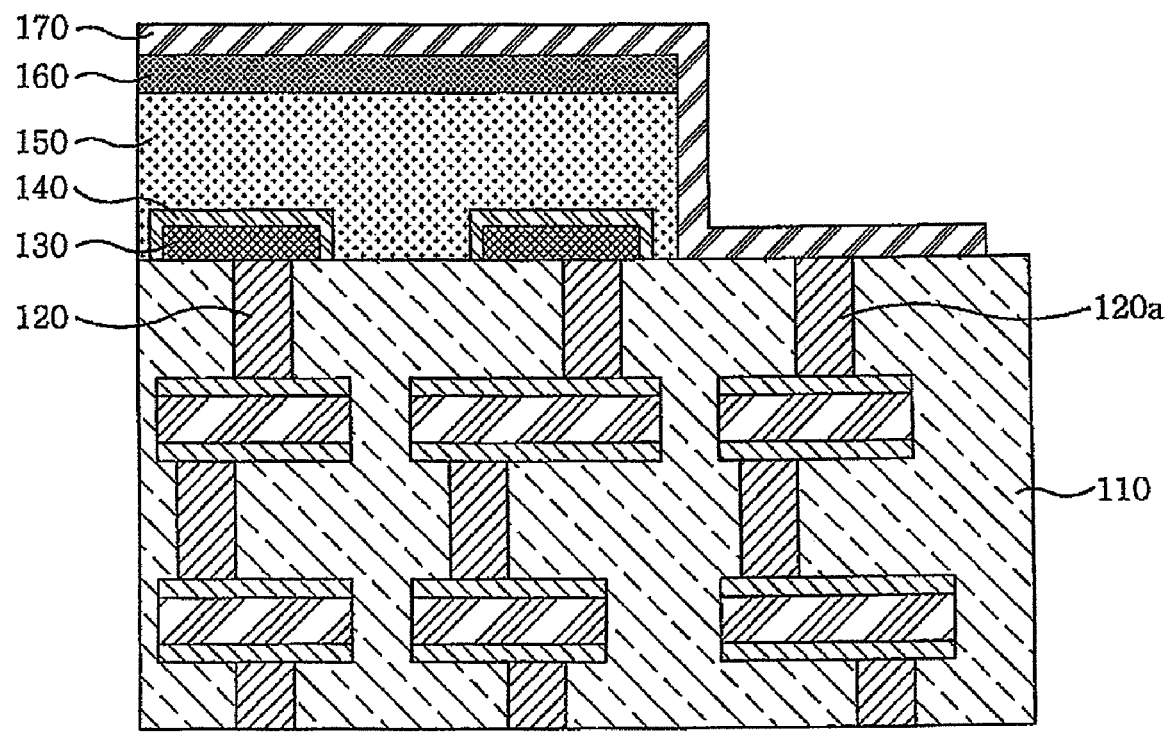

Example FIG. 1 illustrates a vertical integration type image sensor that may include substrate 110, first line 130 formed on and/or over substrate 110, intrinsic layer 150 formed on and/or over first line 130, second conductive layer 160 formed on and/or over intrinsic layer 150, and second line 170 formed on and/or over substrate 110. Here, a COM circuitry (not shown) having a lower line 120 may be formed on and/or over substrate 110. First conductive layer 140 may be formed between first line 130 and intrinsic layer 150.

First line 130 may be composed of various conductive materials such as metal, alloy, and silicide. For example, first line 130 may be composed of aluminum, copper, and cobalt. First line 130 may be patterned by a photodiode unit pixel or by a photodiode unit pixel after first conductive layer 140 is formed on and/or over first line 130.

First conductive layer 140 may be selectively formed and serve to operate as an N-layer of a PIN diode. Particularly, first conductive layer 140 may be composed as an N-type conductive layer formed by N-doped amorphous silicon. First conductive layer 140 may be composed of a-Si:H, a-SiGe:H, a-SiC, a-SiN:H, and a-SiO:H by adding germanium, carbon, nitride, or oxygen to amorphous silicon.

Intrinsic layer 150 may serve to operate as an I-layer of a PIN diode. N-doped amorphous silicon may be used to form intrinsic layer 150. Second conductive layer 160 may serve to operate as a P-layer of a PIN diode, particularly, as a p-type conductive layer. Second conductive layer 160 may be composed of P-doped amorphous silicon. Second line 170 may serve to operate as an upper electrode of a photodiode and be electrically connected to the exposed lower line 120a. Second line 170 may also be formed as a transparent electrode having high light transmissivity and high conductivity. Second line 170 may be composed of indium tin oxide (ITO) or cardium tin oxide (CTO).

Such a vertical integration type image sensor has numerous shortcomings. For instance, second line 170 operates as an upper electrode of a photodiode, and thus, is a core element of the vertical integration image sensor. Because second line 170 may be composed of a metal material such as ITO, it can be easily broken or peeled off due to a lack of flexibility. This will significantly reduce the quality and a reliability of a product using such a vertical integration type image sensor.

SUMMARY

Accordingly, embodiments relate to an image sensor having an upper electrode of a photodiode which is composed of a conductive polymeric material having enhanced flexibility.

Embodiments relate to an image sensor that uses a conductive, transparent polymeric material as a transparent electrode for transmitting light, which is formed at an upper region of a photodiode region.

Embodiments relate to an image sensor including a transparent electrode composed of a conductive transparent polymeric material instead of a metallic material.

Embodiments relate to an image sensor that can include an electrode for transmitting light formed over a substrate at an upper region of a photodiode region, the electrode being composed of a transparent, conductive, polymeric material.

Embodiments relate to a method of manufacturing an image sensor that can include at least one of the following steps: forming a first line over a substrate; and then forming an intrinsic layer over the first line; and then forming a conductive layer over the intrinsic layer; and then forming a second line as an electrode for transmitting light at an upper region of a photodiode region, the second line being composed of a transparent, conductive, polymeric material.

Embodiments relate to an image sensor that can include at least one of the following: a lower line formed over a substrate; a lower conductive layer formed over the first line; an intrinsic layer formed over the first conductive layer; an upper conductive layer formed over the intrinsic layer; and an upper line formed over the substrate including the upper conductive layer, the upper line being composed of a polymeric material.

DRAWINGS

Example FIG. 1 illustrates a vertical integration type image sensor.

Figure 2:
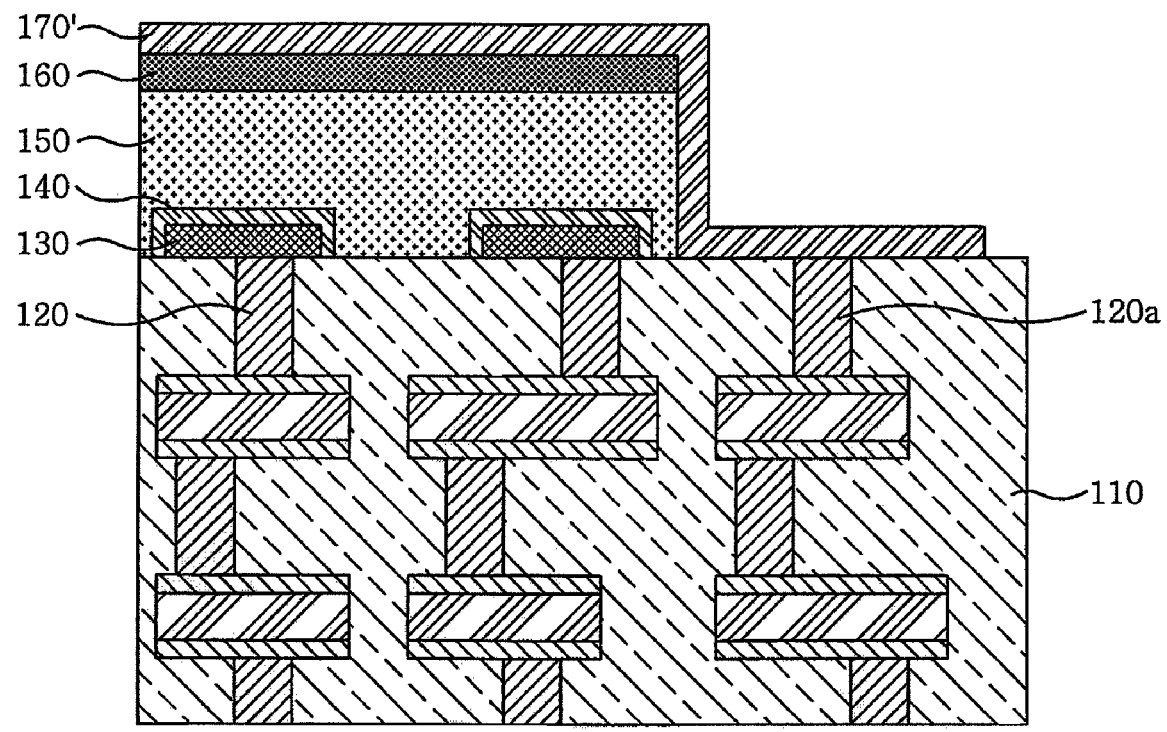

Example FIG. 2 illustrates a vertical integration type image sensor, in accordance with embodiments.

Figure 3:
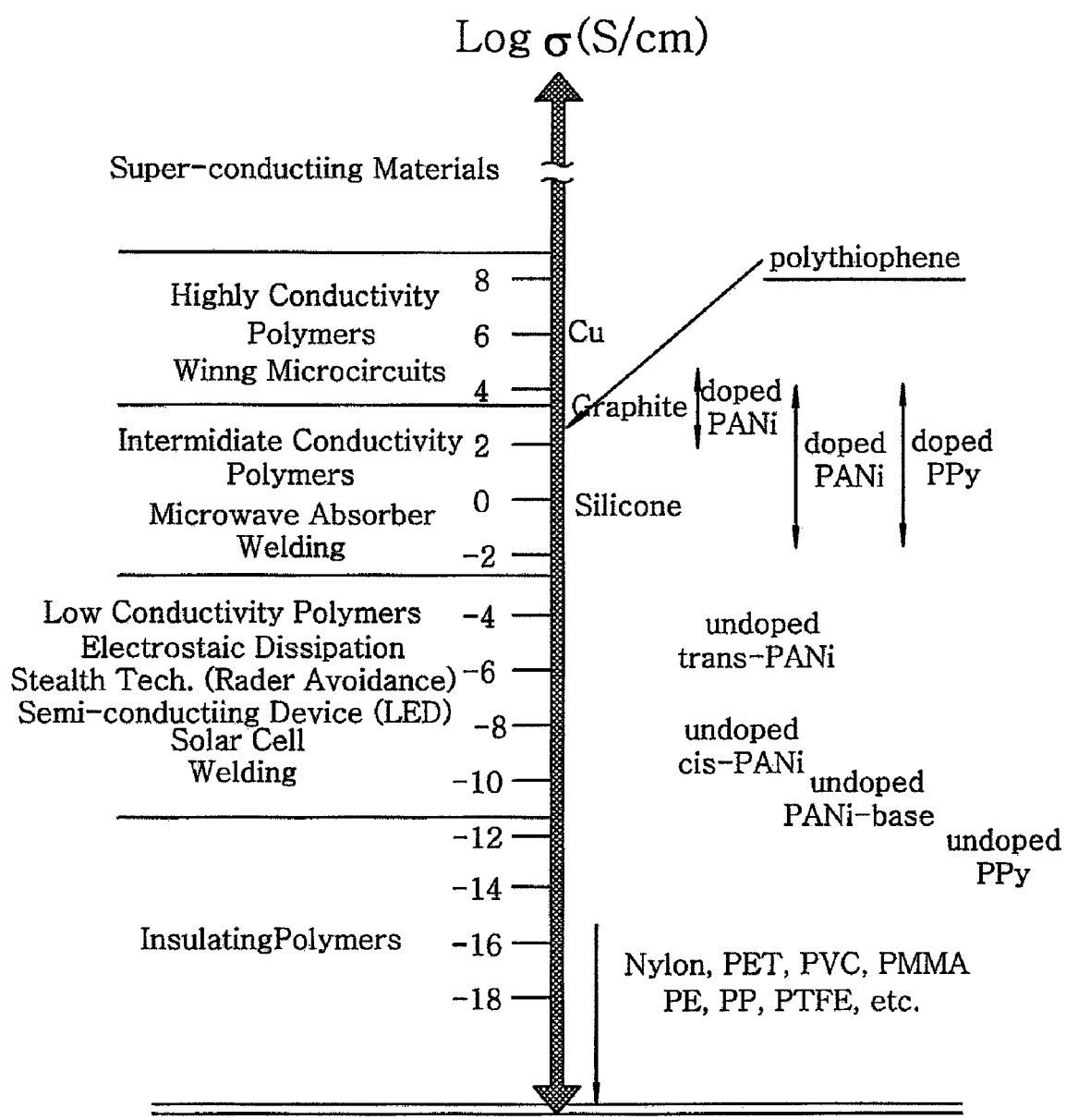

Example FIG. 3 is a diagram illustrating the conductivity of a conductive polymer such as polythiophene, in accordance with embodiments.

DESCRIPTION

As illustrated in example FIG. 2, an image sensor in accordance with embodiments can include first line 130 formed on and/or over substrate 110, first conductive layer 140 formed on and/or over first line 130, intrinsic layer 150 formed on and/or over first conductive layer 140, second conductive layer 160 formed on and/or over intrinsic layer 150 and second line 170 formed on and/or over substrate 110 including second conductive layer 160. Substrate 110 can include a CMOS circuit (not shown) having a lower line 120.

In the image sensor in accordance with embodiments, second line 170' can be formed as an upper electrode of a photodiode. Particularly, second line 170' can be formed as a transparent electrode having enhanced light transmissivity and conductivity. Accordingly, second line 170' can be composed of a conductive polymeric material having enhanced physical properties, notably, excellent flexibility. Such a conductive polymer material may be one selected from the group consisting of polyacetylene, polyaniline, poly (p-phenyline), polypyrole, polythiophene, poly(p-phenyline vinylene), poly (3,4-ethylenedioxy thiophene), and poly(thienylene vinylene). While the above-noted polymeric materials have been specially cited, any polymeric material exhibiting transparent and conductive qualities may be selected.

Such polymeric materials are selected for forming the second line 170' due to having enhanced transparency, i.e., a low absorbancy index, and also having enhanced electric conductivity, as illustrated in example FIG. 3.

A thin film second line 170' composed of conductive polymeric material can be formed by at least one of a spin coating process, a chemical vapor deposition (CVD) process, and a copolymerization process.

In the spin coating process, a viscous liquid polymer can be deposited on and/or over substrate 110. A polymer layer can then be formed on and/or over the entire surface of substrate 110 by rotating substrate 110. The formed polymer layer can then be hardened through a hardening process.

In the copolymerization process, a polymer material composed of monomer can be mixed with an electrolyte, and a polymer layer can then be formed on and/or over substrate 110 by polymerizing the polymer through an electrochemical planting (ECP) process. The polymer layer, formed as a thin film, can then be patterned through at least one of a dry etching process, a wet etching process and an ashing process. Since such etching and ashing processes are well known to those skilled in the art, the detailed descriptions thereof are omitted.

The described forming method is a subtractive method for forming a line through patterning. The subtractive method was widely used to form a metal line by patterning a predetermined material that is easily patterned, such as aluminum (AL).

Moreover, a damascene method may be used to form a line. The damascene method was widely used to form a line made of a material that is not easily patterned, such as copper (Cu). In the damascene method, a metal line is formed through performing a chemical mechanical polishing (CMP) after filling a gap in a trench with a predetermined material such as copper (Cu).

In accordance with embodiments, second line 170' composed of a conducive polymer material can be formed using at least one of the subtractive method and the damascene method.

As described above, the image sensor in accordance with embodiments can include a transparent electrode composed of a flexible material such as a polymeric material. Therefore, the quality and reliability of a product using such an image sensor can be enhanced by preventing the transparent electrode from breaking or peeled off the substrate.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   an electrode for transmitting light formed over a substrate at an upper region of a photodiode region, wherein said electrode is composed of a transparent, conductive, polymeric material selected from a group consisting of polyacetylene, polyaniline, poly(p-phenyline), polypyrole, polythiophene, poly(p-phenyline vinylene), poly (3,4-ethylenedioxy thiophene) and poly(thienylene vinylene).

2. The image sensor of claim 1, wherein said electrode is formed by at least one of a spin coating process, a chemical vapor deposition (CVD) process, and a copolymerization process.

3. The image sensor of claim 1, wherein said electrode is formed using at least one of a subtractive method and a damascene method.

4. An image sensor comprising:
   a lower line formed over a substrate;
   a lower conductive layer formed over said lower line;
   an intrinsic layer formed over said lower conductive layer;
   an upper conductive layer formed over said intrinsic layer; and
   an upper line formed over said substrate including said upper conductive layer, wherein said upper line is composed of a polymeric material selected from a group consisting of polyacetylene, polyaniline, poly(p-phenyline), polypyrole, polythiophene, poly(p-phenyline vinylene), poly(3,4-ethylenedioxy thiophene) and poly (thienylene vinylene).

5. The image sensor of claim 4, wherein said upper line comprises an electrode for transmitting light.

6. The image sensor of claim 4, wherein said upper line is formed over said substrate at an upper region of a photodiode region.

7. The image sensor of claim 4, wherein said upper line is formed by at least one of a spin coating process, a chemical vapor deposition (CVD) process, and a copolymerization process.

8. The image sensor of claim 4, wherein said upper line is formed using at least one of a subtractive method and a damascene method.

9. The image sensor of claim 4, wherein said image sensor comprises a vertical integration type image sensor.

* * * * *